United States Patent
Miyahara et al.

(10) Patent No.: US 7,990,706 B2
(45) Date of Patent: Aug. 2, 2011

(54) COOLING DUCT AND ELECTRONIC APPARATUS

(75) Inventors: Munetoshi Miyahara, Kanagawa (JP); Jun Sawai, Kanagawa (JP)

(73) Assignee: Sony Corporation, Tokyo (JP)

( * ) Notice: Subject to any disclaimer, the term of this patent is extended or adjusted under 35 U.S.C. 154(b) by 186 days.

(21) Appl. No.: 12/341,157

(22) Filed: Dec. 22, 2008

(65) Prior Publication Data
US 2009/0183865 A1 Jul. 23, 2009

(30) Foreign Application Priority Data

Jan. 23, 2008 (JP) ................................. 2008-012147

(51) Int. Cl.
*H05K 7/20* (2006.01)
(52) U.S. Cl. .............. 361/695; 361/679.48; 361/679.49; 361/692; 361/694; 361/697; 165/80.3; 165/121; 454/184
(58) Field of Classification Search .............. 361/679.46, 361/679.48, 679.49, 679.5, 690–697, 719; 454/184; 165/80.2, 80.3, 104.33, 104.34, 165/121, 122, 123, 126, 185; 174/16.3, 252
See application file for complete search history.

(56) References Cited

U.S. PATENT DOCUMENTS

| | | | | |
|---|---|---|---|---|
| 4,674,004 A * | 6/1987 | Smith et al. | .................... | 361/694 |
| 4,851,965 A * | 7/1989 | Gabuzda et al. | ............. | 361/691 |
| 5,076,346 A * | 12/1991 | Otsuka | ........................... | 165/217 |
| 5,195,576 A * | 3/1993 | Hatada et al. | ................ | 165/80.3 |
| 5,218,513 A * | 6/1993 | Brown | ........................... | 361/689 |
| 5,559,673 A * | 9/1996 | Gagnon et al. | ................. | 361/695 |
| 5,566,377 A * | 10/1996 | Lee | ................................. | 361/695 |
| 5,592,363 A * | 1/1997 | Atarashi et al. | ............... | 361/689 |
| 5,640,046 A * | 6/1997 | Suzuki et al. | ................. | 257/714 |
| 5,822,188 A * | 10/1998 | Bullington | ..................... | 361/695 |
| 5,912,802 A * | 6/1999 | Nelson | .......................... | 361/695 |
| 6,134,108 A * | 10/2000 | Patel et al. | ..................... | 361/695 |
| 6,163,453 A * | 12/2000 | Hou et al. | ................. | 361/679.48 |
| 6,462,948 B1 * | 10/2002 | Leija et al. | ..................... | 361/697 |
| 6,525,936 B2 * | 2/2003 | Beitelmal et al. | ............. | 361/695 |
| 6,603,662 B1 * | 8/2003 | Ganrot | .......................... | 361/698 |
| 6,876,549 B2 * | 4/2005 | Beitelmal et al. | ............. | 361/692 |
| 6,895,666 B2 * | 5/2005 | Hong et al. | ...................... | 29/841 |
| 6,999,312 B1 * | 2/2006 | Garnett et al. | ........... | 361/679.54 |
| 7,361,081 B2 * | 4/2008 | Beitelmal et al. | ............. | 454/184 |
| 7,619,889 B2 * | 11/2009 | Yu et al. | ........................ | 361/699 |
| 7,751,189 B2 * | 7/2010 | Ahuja et al. | ................... | 361/697 |

FOREIGN PATENT DOCUMENTS

| | | |
|---|---|---|
| JP | 5-121604 | 5/1993 |
| JP | 8-255855 | 10/1996 |
| JP | 2000-252675 | 9/2000 |
| JP | 2002-76225 | 3/2002 |

* cited by examiner

*Primary Examiner* — Michael V Datskovskiy
(74) *Attorney, Agent, or Firm* — Oblon, Spivak, McClelland, Maier & Neustadt, L.L.P.

(57) ABSTRACT

A cooling duct for cooling heat generating elements inside a casing with outside air includes an intake vent through which outside air taken in from outside the casing is drawn, a guiding unit configured to guide the outside air drawn through the intake vent to a first target element being a heat generating element to be cooled, a discharge vent through which the outside air guided by the guiding unit is discharged to the first target element, and a branch pipe provided in the guiding unit and configured to guide part of the outside air flowing in the guiding unit to a second target element being another heat generating element to be cooled.

6 Claims, 9 Drawing Sheets

COOLING DUCT AND ELECTRONIC APPARATUS

CROSS REFERENCES TO RELATED APPLICATIONS

The present invention contains subject matter related to Japanese Patent Application JP 2008-012147 filed in the Japanese Patent Office on Jan. 23, 2008, the entire contents of which are incorporated herein by reference.

BACKGROUND OF THE INVENTION

1. Field of the Invention

The present invention relates to cooling ducts and electronic apparatuses, and particularly to a cooling duct and an electronic apparatus for efficiently cooling a plurality of heat generating elements inside a casing.

2. Description of the Related Art

There have been proposed a variety of methods for cooling electronic components (heat generating elements) that generate heat inside a casing of an electronic apparatus or the like (see, e.g., Japanese Unexamined Patent Application Publications Nos. 2001-57492 and 5-95062). In particular, as semiconductor technology advances, the packing density and the heat generation density of components, such as integrated circuits (ICs) and large-scale integrations (LSIs), significantly increase. It is thus necessary to provide a powerful method for cooing such powerful heat generating elements.

For example, Japanese Unexamined Patent Application Publication No. 2001-57492 discloses a method in which heat is transferred from heat generating elements through a heat pipe to a heat dissipating fin near an outside air intake vent. The heat dissipating fin is cooled by outside air and thus the heat generating elements are cooled. Japanese Unexamined Patent Application Publication No. 5-95062 discloses a method in which a heat dissipating fin for an LSI is disposed inside a duct through which an air flow passes from an air intake vent to an air discharge vent. The heat dissipating fin is cooled by the air flow and thus the LSI is cooled.

SUMMARY OF THE INVENTION

With the method disclosed in Japanese Unexamined Patent Application Publication No. 2001-57492, it may be difficult to achieve sufficient cooling efficiency and to sufficiently cool ICs and LSIs that are currently available. In the method disclosed in Japanese Unexamined Patent Application Publication No. 5-95062, it is necessary to provide one duct for each LSI. In electronic apparatuses currently available, many ICs and LSIs are often mounted over the entire area inside the casing. Therefore, providing a duct and a fan for each of the ICs and LSIs is difficult in terms of space, and may lead to increased power consumption and operation noise.

It is thus desirable to provide improved efficiency in cooling a plurality of heat generating elements inside a casing.

In accordance with an embodiment of the present invention, there is provided a cooling duct for cooling heat generating elements inside a casing with outside air. The cooling duct includes an intake vent through which outside air taken in from outside the casing is drawn, a guiding unit configured to guide the outside air drawn through the intake vent to a first target element being a heat generating element to be cooled, a discharge vent through which the outside air guided by the guiding unit is discharged to the first target element, and a branch pipe provided in the guiding unit and configured to guide part of the outside air flowing in the guiding unit to a second target element being another heat generating element to be cooled.

The branch pipe may include an internal branch pipe located inside the guiding unit and having a branch vent for taking in part of the outside air flowing inside the guiding unit, and an external branch pipe located outside the guiding unit and configured to guide the outside air taken in through the internal branch pipe to the second target element.

The branch vent may be toward the intake vent.

The external branch pipe may have a notch for discharging part of the outside air taken in through the internal branch pipe to a third target element located near the second target element and being a heat generating element to be cooled.

In accordance with another embodiment of the present invention, there is provided an electronic apparatus having electronic components inside a casing. The electronic apparatus has a cooling duct including an intake vent through which outside air taken in from outside the casing is drawn, a guiding unit configured to guide the outside air drawn through the intake vent to a first target element being a heat generating element to be cooled, a discharge vent through which the outside air guided by the guiding unit is discharged to the first target element, and a branch pipe provided in the guiding unit and configured to guide part of the outside air flowing in the guiding unit to a second target element being another heat generating element to be cooled.

In accordance with an embodiment of the present invention, there are provided an intake vent through which outside air taken in from outside a casing is drawn, a guiding unit configured to guide the outside air drawn through the intake vent to a first target element being a heat generating element to be cooled, a discharge vent through which the outside air guided by the guiding unit is discharged to the first target element, and a branch pipe provided in the guiding unit and configured to guide part of the outside air flowing in the guiding unit to a second target element being another heat generating element to be cooled.

In accordance with another embodiment of the present invention, there is provided a cooling duct including an intake vent through which outside air taken in from outside the casing is drawn, a guiding unit configured to guide the outside air drawn through the intake vent to a first target element being a heat generating element to be cooled, a discharge vent through which the outside air guided by the guiding unit is discharged to the first target element, and a branch pipe provided in the guiding unit and configured to guide part of the outside air flowing in the guiding unit to a second target element being another heat generating element to be cooled.

The present invention allows cooling of a heat generating element and, in particular, makes it possible to efficiently cool a plurality of heat generating elements inside a casing.

DESCRIPTION OF THE PREFERRED EMBODIMENTS

Figure 1:
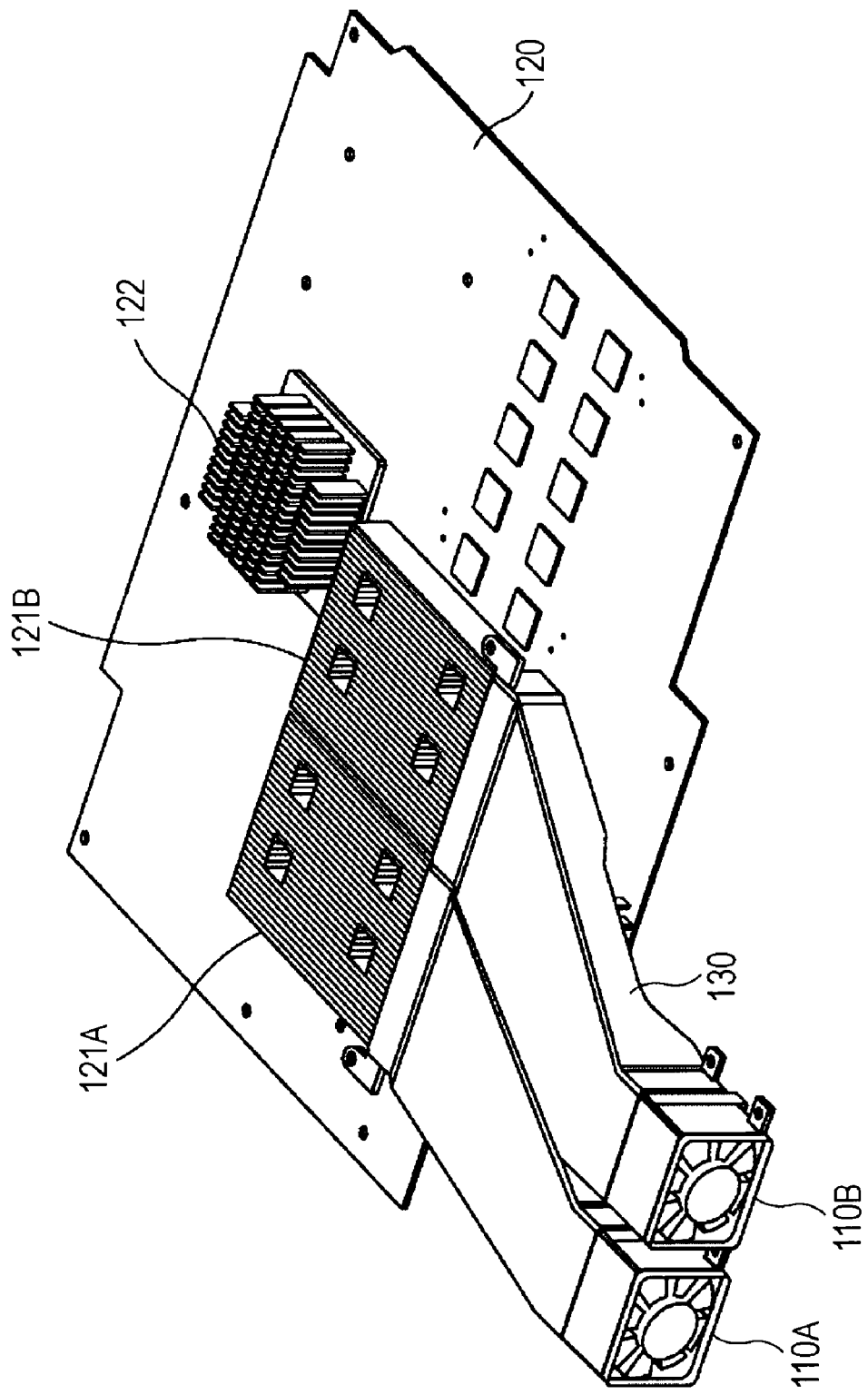
FIG. 1 is a perspective view illustrating part of a structure inside a casing of an electronic apparatus according to an embodiment of the present invention.

FIG. 1 is a perspective view illustrating part of a structure inside a casing of an electronic apparatus according to an embodiment of the present invention. A substrate 120 is a printed circuit board on which various electronic components, such as ICs, are mounted to form an electronic circuit for the electronic apparatus. Many of the electronic components are heat generating elements that generate heat by being driven. Large ICs generating a large amount of heat are provided with heat sinks, such as a heat sink 121A, a heat sink 121B, and a heat sink 122, for improved heat dissipation efficiency.

For higher cooling efficiency, the heat sink 121A and the heat sink 121B for dissipating heat from the large heat generating elements are provided with a cooling fan 110A, a cooling fan 110B, and a cooling duct 130. For cooling the heat sink 121A and the heat sink 121B, air (outside air) taken in from outside the casing through the cooling fan 110A and the cooling fan 110B is forced to pass through the interior of the cooling duct 130.

The outside air taken into the heat sink 121A and the heat sink 121B removes heat therefrom and is discharged from an air discharge vent (not shown) of the casing to the outside. The outside air supplied to the heat sink 121A and the heat sink 121B is partially supplied to the heat sink 122 and cools the heat sink 122.

Figure 2:
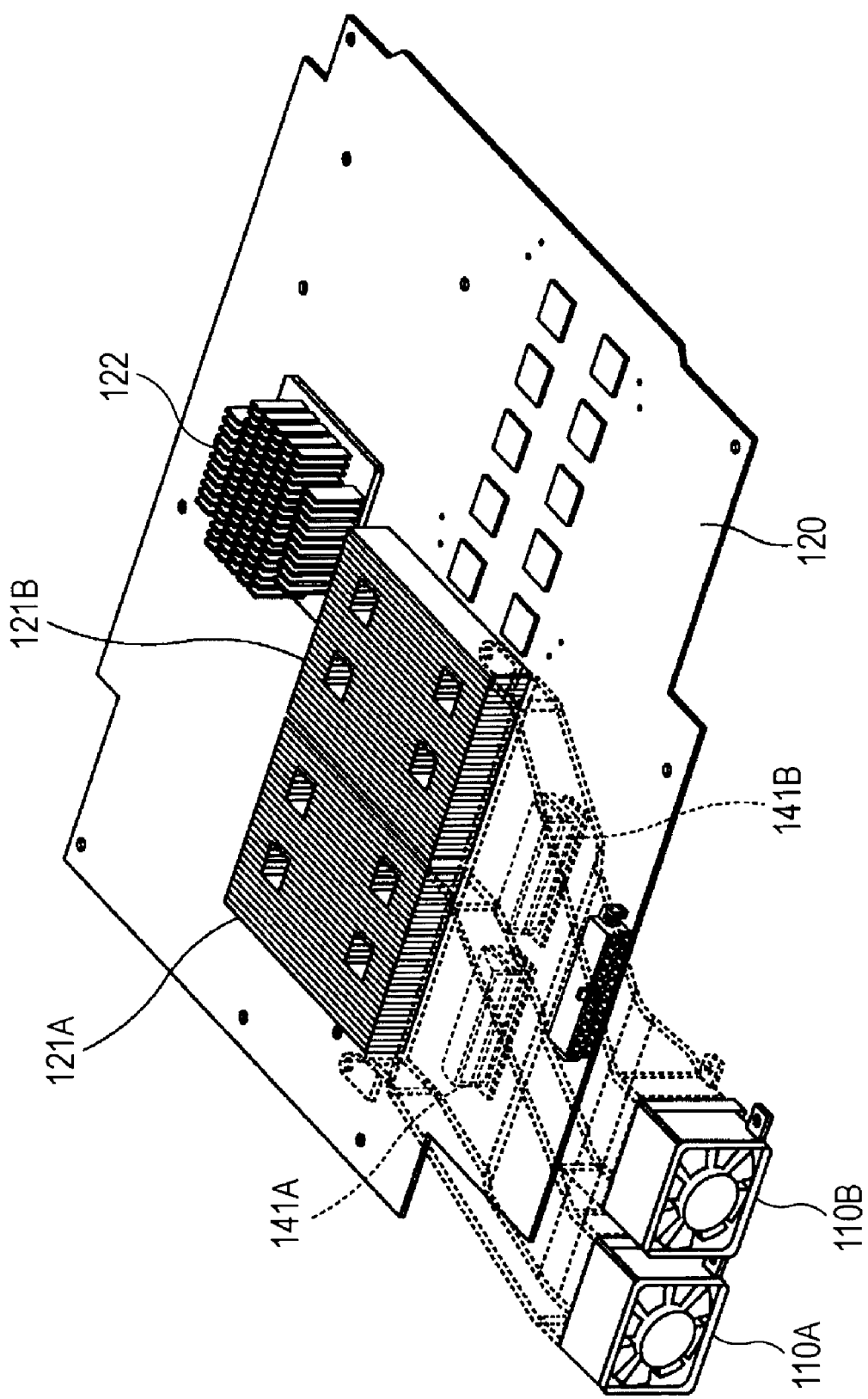
FIG. 2 provides a transparent view of a cooling duct included in the structure of FIG. 1.

FIG. 2 provides a transparent view of the cooling duct 130 of FIG. 1. As illustrated in FIG. 2, branch pipes (described below) are provided in the middle of the cooling duct 130. Part of the outside air passing through the interior of the cooling duct 130 is supplied through the branch pipes to a heat sink 141A and a heat sink 141B that are located under the cooling duct 130 and mounted on the substrate 120.

Figure 3:
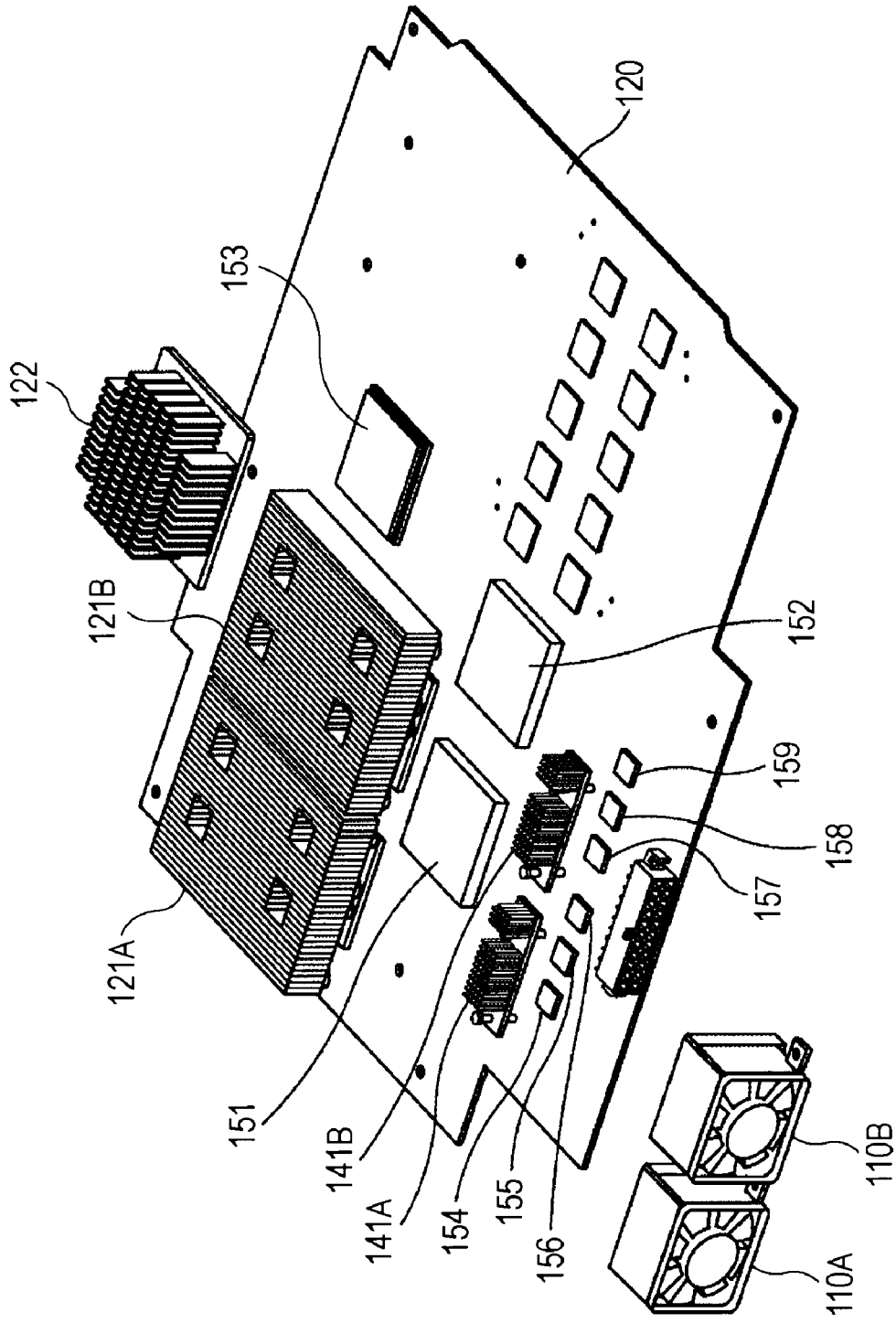
FIG. 3 illustrates part of a configuration on a substrate of FIG. 1.

FIG. 3 illustrates part of a configuration on the substrate 120. As illustrated, on the substrate 120, large ICs 151 and 152 are mounted under the heat sinks 121A and 121B, respectively, while a large IC 153 is mounted under the heat sink 122.

The IC 151 is cooled (i.e., heat generated by the IC 151 is dissipated) by outside air forced through the cooling duct 130 into the heat sink 121A. Likewise, the IC 152 is cooled (i.e., heat generated by the IC 152 is dissipated) by outside air forced through the cooling duct 130 into the heat sink 121B. Also likewise, the IC 153 is cooled (i.e., heat generated by the IC 153 is dissipated) by outside air forced through the cooling duct 130 into the heat sink 122.

Additionally, on the substrate 120, medium-sized ICs 154, 155, and 156 are mounted under the heat sink 141A, while medium-sized ICs 157, 158, and 159 are mounted under the heat sink 141B.

The ICs 154, 155, and 156 are cooled (i.e., heat generated by the ICs 154, 155, and 156 is dissipated) by outside air forced through a branch pipe of the cooling duct 130 into the heat sink 141A. Likewise, the ICs 157, 158, and 159 are cooled (i.e., heat generated by the ICs 157, 158, and 159 is dissipated) by outside air forced through a branch pipe of the cooling duct 130 into the heat sink 141B.

Figure 4:
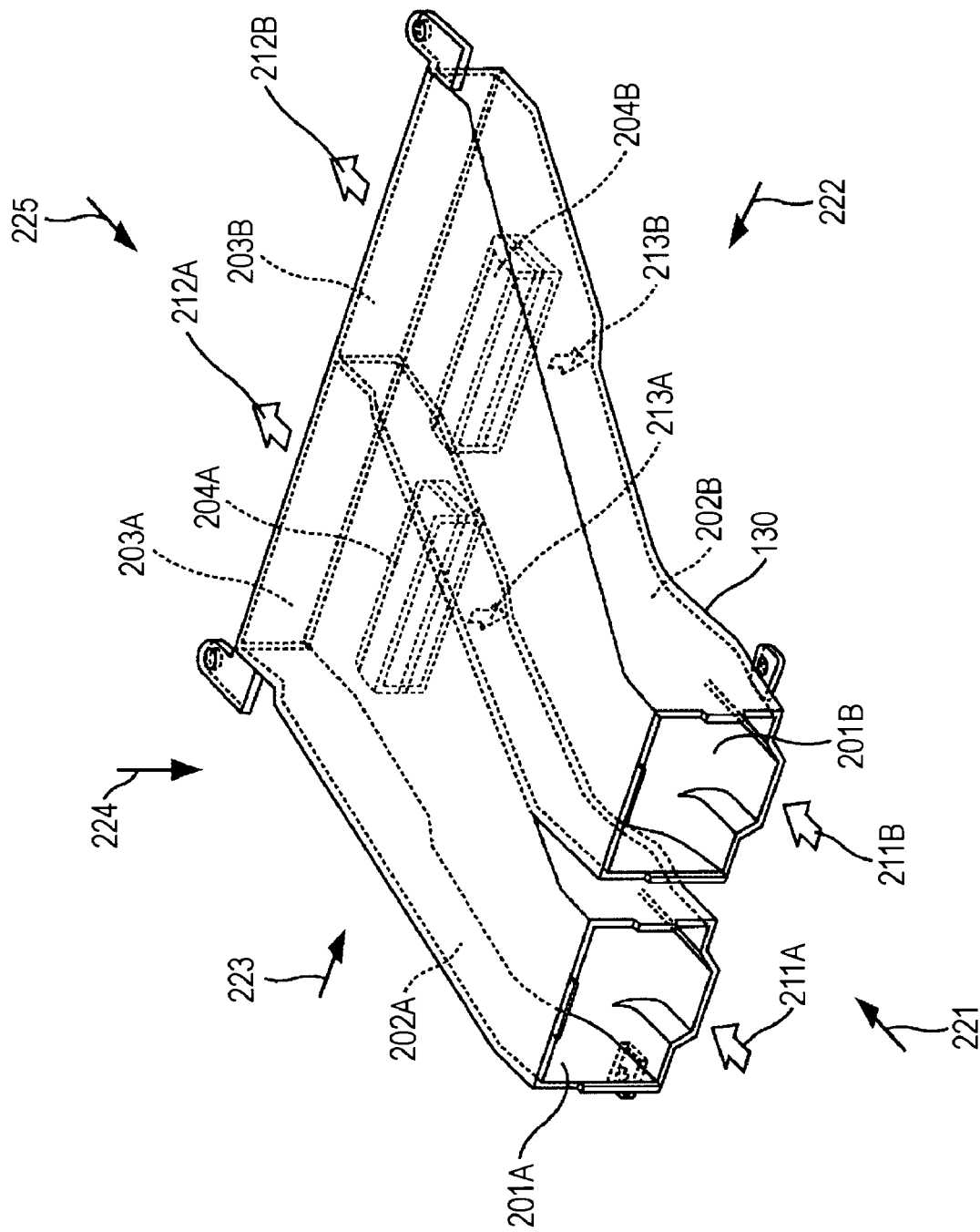
FIG. 4 is a perspective view illustrating a structure of a cooling duct according to an embodiment of the present invention.

FIG. 4 is a perspective view illustrating a structure of a cooling duct according to an embodiment of the present invention. The cooling duct 130 of FIG. 4 has two intake vents (an intake vent 201A and an intake vent 201B), two guiding units (a guiding unit 202A and a guiding unit 202B), two discharge vents (a discharge vent 203A and a discharge vent 203B), and two branch vents (a branch vent 204A and a branch vent 204B).

The intake vent 201A is an opening attached to the cooling fan 110A of FIG. 1. Outside air taken in by the cooling fan 110A is forced through the intake vent 201A into the cooling duct 130 (guiding unit 202A) in the direction of an arrow 211A. The guiding unit 202A is a pipe through which the outside air forced through the intake vent 201A into the cooling duct 130 is guided to the discharge vent 203A or the branch vent 204A (i.e., to a position near a target element to be cooled) (hereinafter, a target element to be cooled is simply referred to as "target element"). The discharge vent 203A is an opening from which the outside air supplied through the guiding unit 202A is discharged toward a target element. Similarly, the branch vent 204A is an opening from which the outside air supplied through the guiding unit 202A is discharged toward a target element.

That is, the outside air taken in by the cooling fan 110A is drawn from the intake vent 201A into the guiding unit 202A as indicated by the arrow 211A and flows along the guiding unit 202A. Part of the outside air is discharged from the discharge vent 203A as indicated by an arrow 212A to a target element (heat sink 121A), while the remaining outside air is discharged from the branch vent 204A as indicated by an arrow 213A to a target element (heat sink 141A).

The intake vent 201B is an opening attached to the cooling fan 110B of FIG. 1. Outside air taken in by the cooling fan 110B is forced through the intake vent 201B into the cooling duct 130 (guiding unit 202B) in the direction of an arrow 211B. The guiding unit 202B is a pipe through which the outside air forced through the intake vent 201B into the cooling duct 130 is guided to the discharge vent 203B or the branch vent 204B (i.e., to a position near a target element). The discharge vent 203B is an opening from which the outside air supplied through the guiding unit 202B is discharged toward a target element. Similarly, the branch vent 204B is an opening from which the outside air supplied through the guiding unit 202B is discharged toward a target element.

That is, the outside air taken in by the cooling fan 110B is drawn from the intake vent 201B into the guiding unit 202B as indicated by the arrow 211B and flows along the guiding unit 202B. Part of the outside air is discharged from the discharge vent 203B as indicated by an arrow 212B to a target element (heat sink 121B), while the remaining outside air is discharged from the branch vent 204B as indicated by an arrow 213B to a target element (heat sink 141B).

Figure 5:
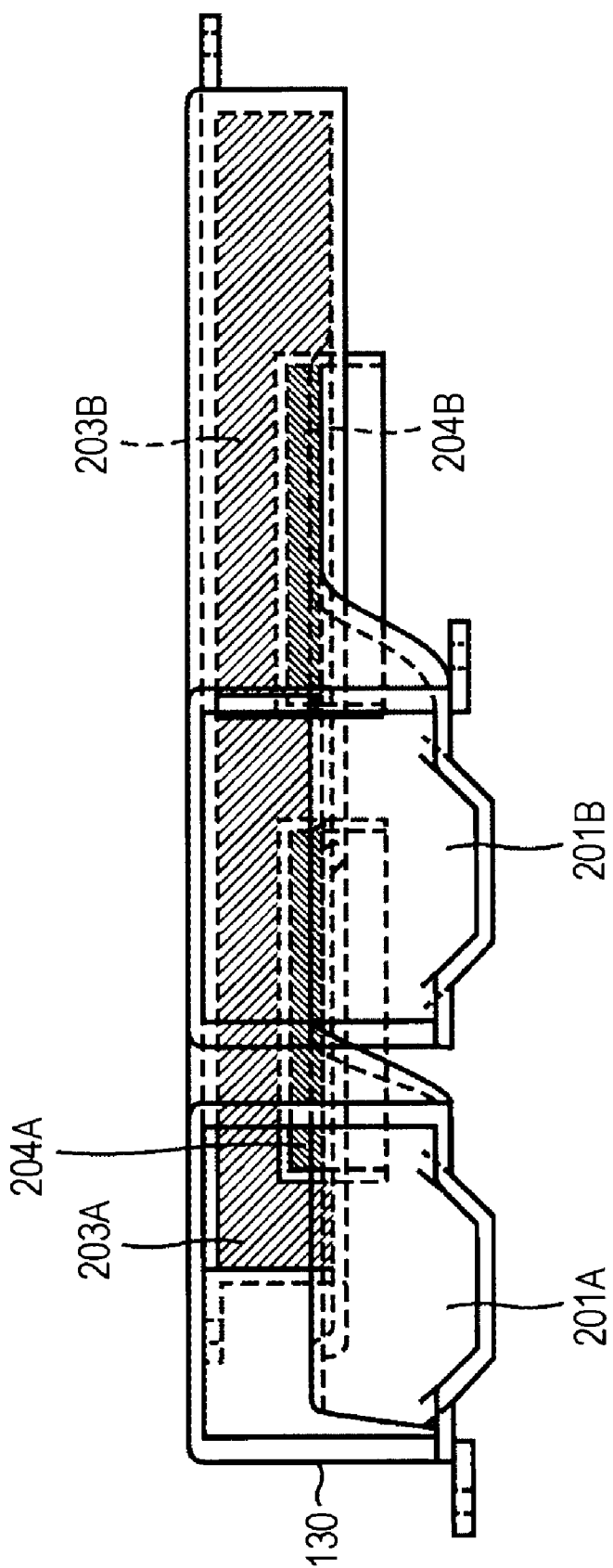
FIG. 5 is a plan view of the cooling duct of FIG. 4.

In the interior of the guiding unit 202A, the branch vent 204A is open to the intake vent 201A as illustrated in FIG. 5. Similarly, in the interior of the guiding unit 202B, the branch vent 204B is open to the intake vent 201B as illustrated in FIG. 5.

FIG. 5 illustrates the cooling duct 130 as viewed from the intake vent 201A and the intake vent 201B and in the direction of an arrow 221 of FIG. 4.

In FIG. 5, regions indicated by oblique lines running from top left to bottom right corresponds to the discharge vent 203A and the discharge vent 203B, while regions indicated by oblique lines running from bottom left to top right corresponds to the branch vent 204A and the branch vent 204B. Dashed lines represent a structure not visible from outside the cooling duct 130. As illustrated in FIG. 5, the branch vent 204A and branch vent 204B inside the guiding unit 202A and guiding unit 202B are toward the intake vent 201A and intake vent 201B, respectively.

Figure 6:
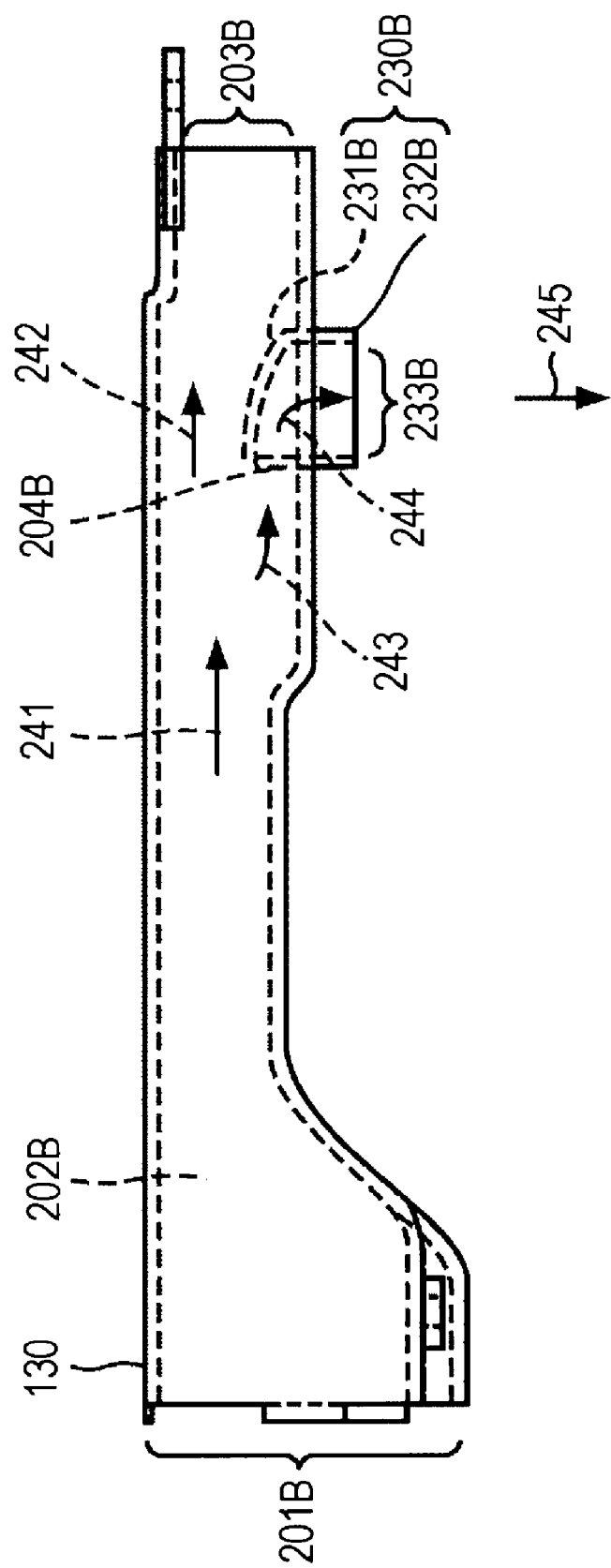
FIG. 6 is another plan view of the cooling duct of FIG. 4.

FIG. 6 illustrates the cooling duct 130 as viewed in the direction of an arrow 222 of FIG. 4. That is, the right side of the cooling duct 130 (when viewed from the intake vent 201A and the intake vent 201B of FIG. 4) is illustrated in FIG. 6.

As illustrated in FIG. 6, the guiding unit 202B is provided with a branch pipe 230B. The branch pipe 230B includes an internal branch pipe 231B inside the cooling duct 130 (guiding unit 202B) and an external branch pipe 232B outside the cooling duct 130. The internal branch pipe 231B is a pipe through which outside air flowing inside the guiding unit 202B is partially taken in. The branch vent 204B in the guiding unit 202B is an opening of the internal branch pipe 231B. Outside air guided by the internal branch pipe 231B is further guided by the external branch pipe 232B to target elements.

Outside air flowing inside the guiding unit 202B in the direction of an arrow 241 is partially discharged from the discharge vent 203B as indicated by an arrow 242, supplied to the heat sink 121B, and cools the heat sink 121B. At the same time, the outside air flowing inside the guiding unit 202B in the direction of the arrow 241 is partially drawn into the branch vent 204B as indicated by an arrow 243. As indicated by an arrow 244, the outside air drawn into the branch vent 204B is diverted downward (in the drawing) by the internal branch pipe 231B. Then, as indicated by an arrow 245, the outside air is discharged from the external branch pipe 232B through a branch discharge vent 233B, supplied to the heat sink 141B, and cools the heat sink 141B.

The guiding unit 202A is provided with a branch pipe 230A (described below) equivalent to the branch pipe 230B.

Figure 7:
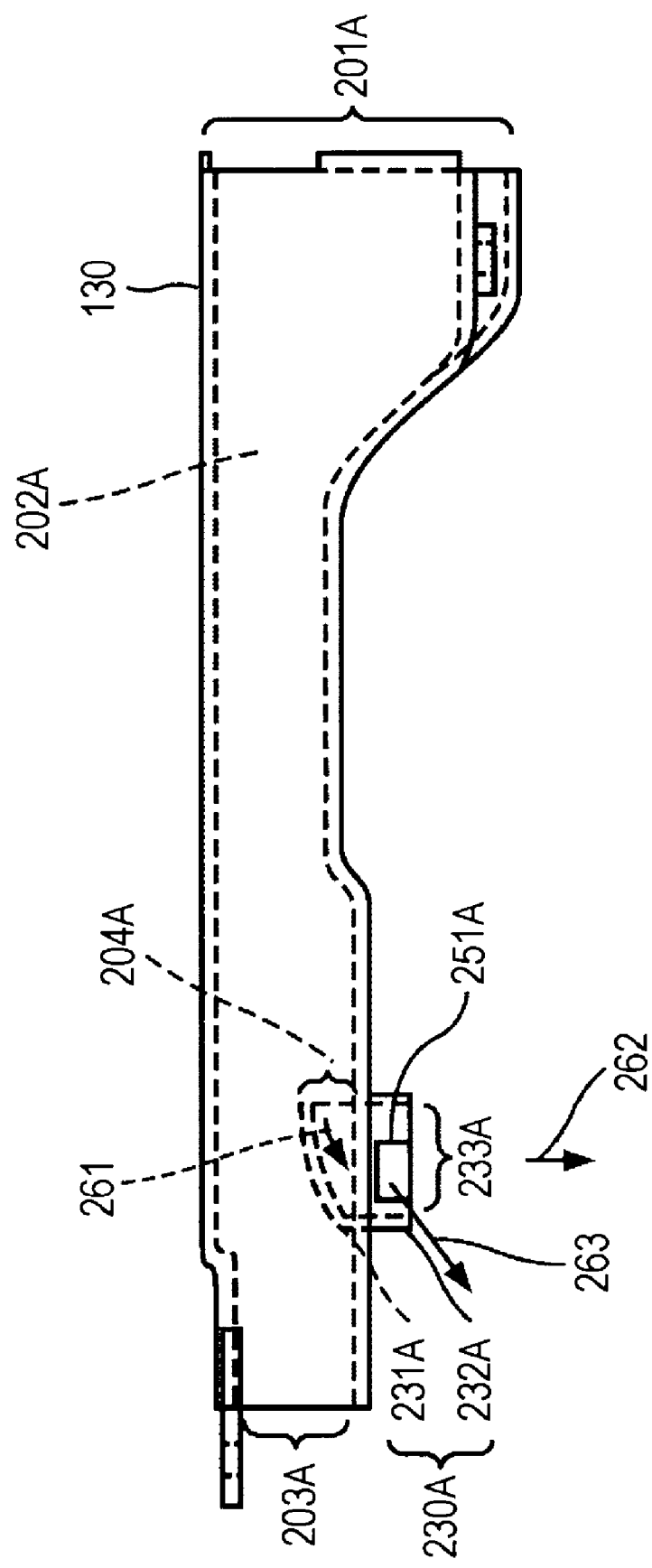
FIG. 7 is another plan view of the cooling duct of FIG. 4.

FIG. 7 illustrates the cooling duct 130 as viewed in the direction of an arrow 223 of FIG. 4. That is, the left side of the cooling duct 130 (when viewed from the intake vent 201A and the intake vent 201B of FIG. 4) is illustrated in FIG. 7.

As illustrated in FIG. 7, the branch pipe 230A includes an internal branch pipe 231A inside the cooling duct 130 (guiding unit 202A) and an external branch pipe 232A outside the cooling duct 130. The internal branch pipe 231A is a pipe through which outside air flowing inside the guiding unit 202A is partially taken in. The branch vent 204A in the guiding unit 202A is an opening of the internal branch pipe 231A. Outside air guided by the internal branch pipe 231A is further guided by the external branch pipe 232A to target elements.

As indicated by an arrow 261, the outside air drawn into the branch vent 204A is diverted downward (in the drawing) by the internal branch pipe 231A. Then, as indicated by an arrow 262, the outside air is discharged from the external branch pipe 232A through a branch discharge vent 233A, supplied to the heat sink 141A, and cools the heat sink 141A.

The external branch pipe 232A has a notch 251A. As indicated by an arrow 263, the outside air passing through the branch pipe 230A partially leaks from the notch 251A and is supplied to heat generating elements (electronic components) near the heat sink 141A (i.e., electronic components near the heat sink 141A are cooled).

Figure 8:
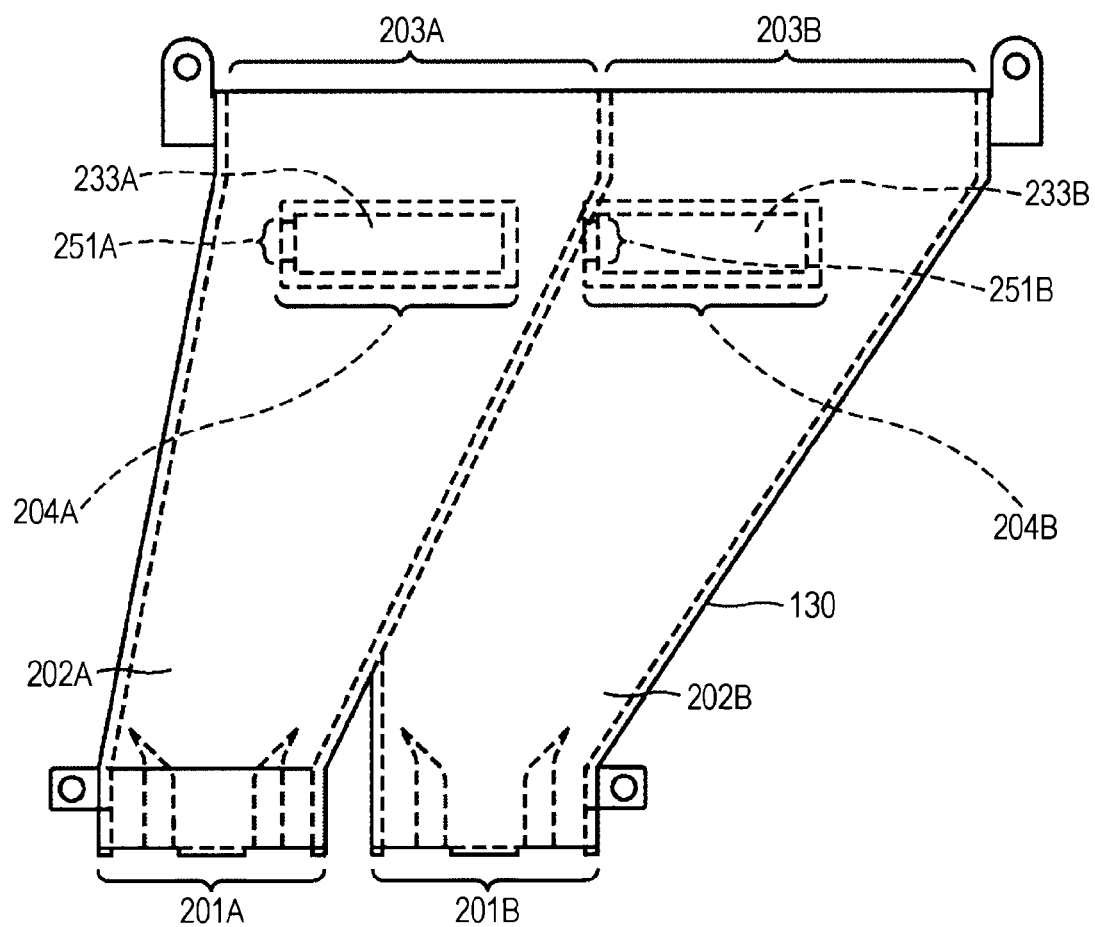
FIG. 8 is another plan view of the cooling duct of FIG. 4.

As illustrated in FIG. 8, the external branch pipe 232B of the branch pipe 230B has a notch 251B equivalent to the notch 251A of the external branch pipe 232A.

FIG. 8 illustrates the cooling duct 130 as viewed from the upper side thereof and in the direction of an arrow 224 of FIG. 4.

As illustrated in FIG. 8, the guiding unit 202A is provided with the branch vent 204A, while the external branch pipe 232A is provided with the notch 251A. Similarly, the guiding unit 202B is provided with the branch vent 204B, while the external branch pipe 232B is provided with the notch 251B. The notch 251B allows outside air to be supplied to electronic components mounted on the substrate 120 and between the branch pipe 230A and the branch pipe 230B, so that these electronic components are cooled by the outside air.

Figure 9:
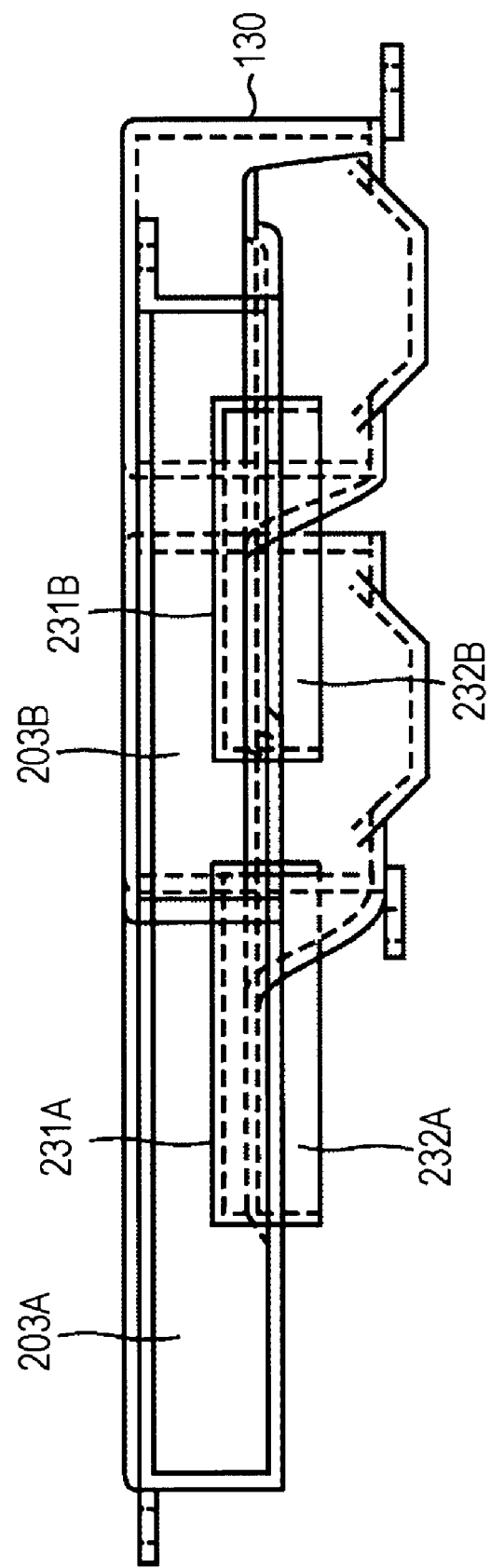
FIG. 9 is another plan view of the cooling duct of FIG. 4.

FIG. 9 illustrates the cooling duct 130 as viewed from the discharge vent 203A and the discharge vent 203B and in the direction of an arrow 225 of FIG. 4.

As illustrated in FIG. 9, the internal branch pipe 231A and the internal branch pipe 231B partially occupy the respective interiors of the guiding unit 202A and the guiding unit 202B. Therefore, outside air taken into the cooling duct 130 is at least partially supplied to the discharge vent 203A and the discharge vent 203B.

As described above, the cooling duct 130 according to an embodiment of the present invention is provided with not only discharge vents, but also branch pipes in respective guiding units. Therefore, the cooling duct 130 allows outside air to be simultaneously supplied to a plurality of electronic components (heat generating elements), so that cooling efficiency can be improved. At the same time, since the size of a cooling system including a cooling fan and a cooling duct is not unnecessarily increased, a compact casing of an electronic apparatus can be provided.

As described above, each of the branch pipes includes an internal branch pipe inside the guiding unit and an external branch pipe outside the guiding unit. The internal branch pipe partially occupies the interior of the guiding unit and has a branch vent open to the intake vent. Therefore, part of the outside air flowing through the interior of the guiding unit can be reliably taken into the internal branch pipe and guided to the external branch pipe. The outside air taken in through the guiding unit is rectified by the external branch pipe outside the guiding unit and guided to a target element. Thus, the target element can be efficiently cooled.

The external branch pipe may be flared toward a branch discharge vent. With this structure, the cooling duct 130 allows outside air discharged from the branch discharge vent to be supplied further to elements around the target element (i.e., elements around the target element can be cooled).

As described above, the external branch pipe has a notch through which outside air is supplied to elements arranged near the target element (i.e., elements arranged near the target element can be cooled). The position, size, number, and shape of the notch are optional.

Although the cooling duct 130 has two intake vents, two guiding units, two discharge vents, and two branch pipes in the above discussion, the number of each of these components is optional. The branch pipes and the branch vents may be of any size, shape, and number as long as outside air flowing inside the guiding units can be partially taken thereinto. For example, one guiding unit may have a plurality of branch pipes. The positions of the branch pipes are determined by an arrangement of electronic components on the substrate 120. In other words, the branch pipes may be provided at any positions in the guiding unit. For example, when one guiding unit has a plurality of branch pipes, the branch pipes may be arranged along, across, or obliquely across the flowing direction of outside air.

Embodiments of the present invention are not limited to those described above, and various modifications may be made without departing from the scope of the present invention.

What is claimed is:
1. A cooling duct for cooling heat generating elements inside a casing with outside air, the cooling duct comprising:
an intake vent through which outside air taken in from outside the casing is drawn;

a guiding unit configured to guide the outside air drawn through the intake vent to a first target element being a heat generating element to be cooled;

a discharge vent through which the outside air guided by the guiding unit is discharged to the first target element; and a branch pipe provided in the guiding unit and configured to guide part of the outside air flowing in the guiding unit downward to a second target element located below the guiding unit, wherein the branch pipe includes:
- an internal branch pipe located inside the guiding unit and having a branch vent for taking in part of the outside air flowing inside the guiding unit; and
- an external branch pipe located outside the guiding unit and configured to guide the outside air taken in through the internal branch pipe to the second target element, and wherein the external branch pipe has a notch for discharging part of the outside air taken in through the internal branch pipe to a third target element located near the second target element and being a heat generating element to be cooled.

2. The cooling duct according to claim 1, wherein an opening of the branch vent faces the intake vent.

3. The cooling duct according to claim 1, further including:
- a second intake vent through which outside air taken in from outside the casing is drawn, the second intake vent being adjacent to the intake vent;
- a second guiding unit configured to guide the outside air drawn through the second intake vent to a fourth target element being a heat generating element to be cooled, the second guiding unit being adjacent and parallel to the guiding unit;
- a second discharge vent through which the outside air guided by the second guiding unit is discharged to the fourth target element, the second discharge vent being adjacent to the discharge vent; and
- a second branch pipe provided in the second guiding unit and configured to guide part of the outside air flowing in the second guiding unit downward to a fifth target element located below the second guiding unit, the second branch pipe being adjacent and parallel to the branch pipe.

4. The cooling duct according to claim 1, wherein the external branch pipe is flared toward the second target element.

5. A cooling duct for cooling heat generating elements inside a casing with outside air, the cooling duct comprising:
- an intake vent through which outside air taken in from outside the casing is drawn;
- a guiding unit configured to guide the outside air drawn through the intake vent to a first target element being a heat generating element to be cooled;
- a discharge vent through which the outside air guided by the guiding unit is discharged to the first target element; and
- a branch pipe provided in the guiding unit and configured to guide part of the outside air flowing in the guiding unit to a second target element being another heat generating element to be cooled, wherein the branch pipe includes:
- an internal branch pipe located inside the guiding unit and having a branch vent for taking in part of the outside air flowing inside the guiding unit; and
- an external branch pipe located outside the guiding unit and configured to guide the outside air taken in through the internal branch pipe to the second target element, and wherein the external branch pipe has a notch for discharging part of the outside air taken in through the internal branch pipe to a third target element located near the second target element and being a heat generating element to be cooled.

6. An electronic apparatus having electronic components inside a casing, the electronic apparatus comprising a cooling duct including:
- an intake vent through which outside air taken in from outside the casing is drawn;
- a guiding unit configured to guide the outside air drawn through the intake vent to a first target element being a heat generating element to be cooled;
- a discharge vent through which the outside air guided by the guiding unit is discharged to the first target element; and
- a branch pipe provided in the guiding unit and configured to guide part of the outside air flowing in the guiding unit downward to a second target element located below the guiding unit, wherein the branch pipe includes:
  - an internal branch pipe located inside the guiding unit and having a branch vent for taking in part of the outside air flowing inside the guiding unit; and
  - an external branch pipe located outside the guiding unit and configured to guide the outside air taken in through the internal branch pipe to the second target element, and wherein the external branch pipe has a notch for discharging part of the outside air taken in through the internal branch pipe to a third target element located near the second target element and being a heat generating element to be cooled.

* * * * *